United States Patent
Reijonen et al.

(10) Patent No.: US 8,779,351 B2
(45) Date of Patent: Jul. 15, 2014

(54) ION SOURCE EMPLOYING SECONDARY ELECTRON GENERATION

(71) Applicant: Schlumberger Technology Corporation, Sugar Land, TX (US)

(72) Inventors: Jani Reijonen, Princeton, NJ (US); Irina Molodetsky, Princeton Junction, NJ (US); Kenneth E. Stephenson, Plainsboro, NJ (US)

(73) Assignee: Schlumberger Technology Corporation, Sugar Land, TX (US)

( * ) Notice: Subject to any disclaimer, the term of this patent is extended or adjusted under 35 U.S.C. 154(b) by 0 days.

(21) Appl. No.: 13/720,699

(22) Filed: Dec. 19, 2012

(65) Prior Publication Data

US 2014/0166872 A1    Jun. 19, 2014

(51) Int. Cl.
*G01V 5/10* (2006.01)
*H01J 37/08* (2006.01)
*G01V 5/04* (2006.01)

(52) U.S. Cl.
CPC . *G01V 5/10* (2013.01); *H01J 37/08* (2013.01); *G01V 5/04* (2013.01)
USPC .......................................................... 250/256

(58) Field of Classification Search
CPC ............ G01V 5/10; G01V 5/04; E21B 47/00; H01J 27/02; H01J 37/08
USPC .......................................................... 250/256
See application file for complete search history.

(56) References Cited

U.S. PATENT DOCUMENTS

| | | | | |
|---|---|---|---|---|
| 3,619,684 A | * | 11/1971 | Andrew et al. ........... | 315/111.31 |
| 3,786,258 A | * | 1/1974 | Schmidt ........................ | 376/115 |
| 4,873,445 A | * | 10/1989 | Le Jeune .................... | 250/423 R |
| 5,293,410 A | * | 3/1994 | Chen et al. ..................... | 376/108 |
| 5,675,606 A | * | 10/1997 | Brainard et al. ......... | 315/111.71 |
| 2003/0223528 A1 | * | 12/2003 | Miley et al. .................... | 376/113 |
| 2011/0103554 A1 | * | 5/2011 | Charette et al. ............... | 378/138 |
| 2011/0114830 A1 | | 5/2011 | Reijonen et al. | |
| 2011/0180698 A1 | | 7/2011 | Stephenson | |

FOREIGN PATENT DOCUMENTS

WO    2009070535 A    6/2004
WO    2009076291 A1   6/2009

OTHER PUBLICATIONS

International Search Report and Written Opinion issued in PCT/US2013/074583 on Mar. 20, 2014, 6 pages.
International Search Report and Written Opinion issued in PCT/US2013/0737486 on Mar. 20, 2014, 7 pages.

* cited by examiner

*Primary Examiner* — Marcus Taningco
(74) *Attorney, Agent, or Firm* — Jeremy Berman

(57) ABSTRACT

An ion source includes a cathode emitting primary electrons, a cathode grid downstream of the cathode, a reflector electrode downstream of the cathode grid, a reflector grid radially inward of the reflector electrode, and an extractor electrode downstream of the reflector electrode. The cathode and the cathode grid have a voltage difference such that the electric field accelerates the primary electrons on a trajectory toward the extractor electrode. The reflector grid and the extractor electrode have a voltage difference such that the electric field repels the primary electrons on a trajectory away from the extractor electrode and toward the reflector electrode. The cathode and reflector electrode have a voltage difference such that some primary electrons strike the reflector electrode, creating secondary electrons. The reflector grid has a positive potential such that the electric field attracts the primary and secondary electrons into the ionization region where they interact with ionizable gas.

20 Claims, 4 Drawing Sheets

ION SOURCE EMPLOYING SECONDARY ELECTRON GENERATION

FIELD OF THE DISCLOSURE

The present disclosure is related to the field of ion sources, and, more particularly, to ion sources for use in particle accelerators and/or radiation generators.

BACKGROUND

Well logging instruments that utilize radiation generators, such as neutron generators, have proven incredibly useful in formation evaluation. Such a neutron generator may include an ion source and a target. An electric field is generated within the neutron generator that accelerates the ions generated by the ion source toward the target at a speed sufficient such that, when the ions are stopped by the target, neutrons are generated and directed into a formation into which the neutron generator is placed. The neutrons interact with atoms in the formation, and those interactions can be detected and analyzed in order to determine various pieces of information about the formation.

The generation of more neutrons for a given time period is desirable since it may allow an increase in the amount of information collected about the formation. Since the number of neutrons generated is related to the number of ions accelerated into the target, ion generators that generate additional ions are desirable. In addition, ion generators that generate additional ions are also desirable because they might result in a neutron generator that generates a larger number of neutrons than typical neutron generators for a given amount of power. This is desirable because power is often limited in well logging applications.

As such, further advances in the area of ion sources for neutron generators are desirable. It is desired for such ion sources to generate a larger number of ions than current ion sources.

SUMMARY

This summary is provided to introduce a selection of concepts that are further described below in the detailed description. This summary is not intended to identify key or essential features of the claimed subject matter, nor is it intended to be used as an aid in limiting the scope of the claimed subject matter.

An ion source for use in a radiation generator may include a cathode to emit primary electrons, a cathode grid downstream of the cathode, a reflector electrode downstream of the cathode grid, a reflector grid radially inward of the reflector electrode, and an extractor electrode downstream of the reflector electrode, the extractor electrode and cathode grid defining an ionization region therebetween. The cathode and the cathode grid may have a first voltage difference such that a resultant electric field in the ion source accelerates the primary electrons through the cathode grid and into the ionization region on a trajectory toward the extractor electrode. The reflector grid and the extractor electrode may have a second voltage difference less than the first voltage difference such that the electric field slows the primary electrons as they near the extractor electrode and repels the primary electrons on a trajectory away from the extractor electrode and toward the reflector electrode. The cathode and reflector electrode may have a third voltage difference less than the first voltage difference such that some of the primary electrons are attracted to and strike the reflector electrode, creating secondary electrons having an electron energy less than the primary electrons. The reflector grid has a positive potential with respect to the reflector electrode such that the electric field attracts the primary and secondary electrons away from the reflector electrode and into the ionization region. At least some of the primary or secondary electrons, when in the ionization region, interacting with an ionizable gas to create ions.

Another aspect is directed to a well logging instrument that may include a sonde housing, and a radiation generator carried by the sonde housing. The radiation generator may include an ion source. The ion source may include a cathode to emit primary electrons, a cathode grid downstream of the cathode, a reflector electrode downstream of the cathode grid, a reflector grid radially inward of the reflector electrode, and an extractor electrode downstream of the reflector electrode, the extractor electrode and cathode grid defining an ionization region therebetween. The cathode and the cathode grid may have a first voltage difference such that a resultant electric field in the ion source accelerates the primary electrons through the cathode grid and into the ionization region on a trajectory toward the extractor electrode. The reflector grid and the extractor electrode may have a second voltage difference less than the first voltage difference such that the electric field slows the primary electrons as they near the extractor electrode and repels the primary electrons on a trajectory away from the extractor electrode and toward the reflector electrode. The cathode and reflector electrode may have a third voltage difference less than the first voltage difference such that some of the primary electrons are attracted to and strike the reflector electrode, creating secondary electrons having an electron energy less than the primary electrons. The reflector grid has a positive potential with respect to the reflector electrode such that the electric field attracts the primary and secondary electrons away from the reflector electrode and into the ionization region. At least some of the primary or secondary electrons, when in the ionization region, interacting with an ionizable gas to create ions.

A method aspect is directed to a method of operating an ion source in a radiation generator. The method may include emitting primary electrons from a cathode. The method may also include generating a first voltage difference between the cathode and a cathode grid positioned downstream of the cathode grid such that a resultant electric field in the ion source accelerates the primary electrons through the cathode grid and into an ionization region on a trajectory toward an extractor electrode. The method may further include generating a second voltage difference less than the first voltage difference between a reflector grid downstream of the cathode grid and the extractor electrode such that the electric field slows the primary electrons as they near the extractor electrode and repels the primary electrons on a trajectory away from the extractor electrode and toward a reflector electrode radially outward of the reflector grid. The method may additionally include generating a third voltage difference less than the first voltage difference between the cathode and the reflector electrode such that some of the primary electrons are attracted to and strike the reflector electrode, creating secondary electrons having an electron energy less than the primary electrons. The method may moreover include generating a positive potential at the reflector grid with respect to the reflector electrode such that the electric field attracts the primary and secondary electrons away from the reflector electrode and into the ionization region, and generating ions via interactions between at least some of the primary or secondary electrons, when in the ionization region, and an ionizable gas.

DETAILED DESCRIPTION

One or more embodiments of the present disclosure will be described below. These described embodiments are only examples of the presently disclosed techniques. Additionally, in an effort to provide a concise description, all features of an actual implementation may not be described in the specification. It should be appreciated that in the development of any such actual implementation, as in any engineering or design project, numerous implementation-specific decisions may be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Figure 1:
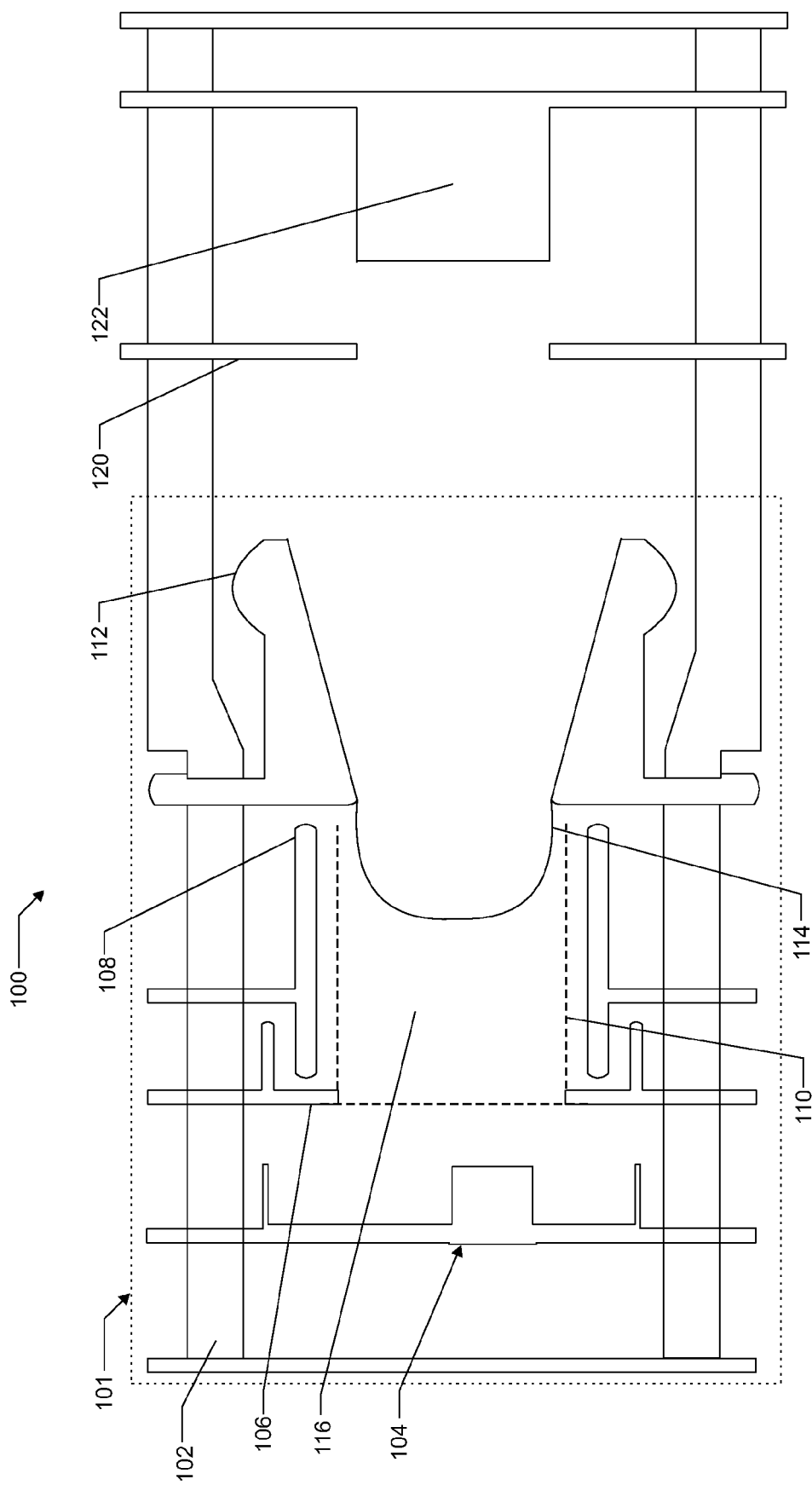
FIG. 1 is a schematic cutaway view of a radiation generator employing an ion source in accordance with the present disclosure.
Figure 2:
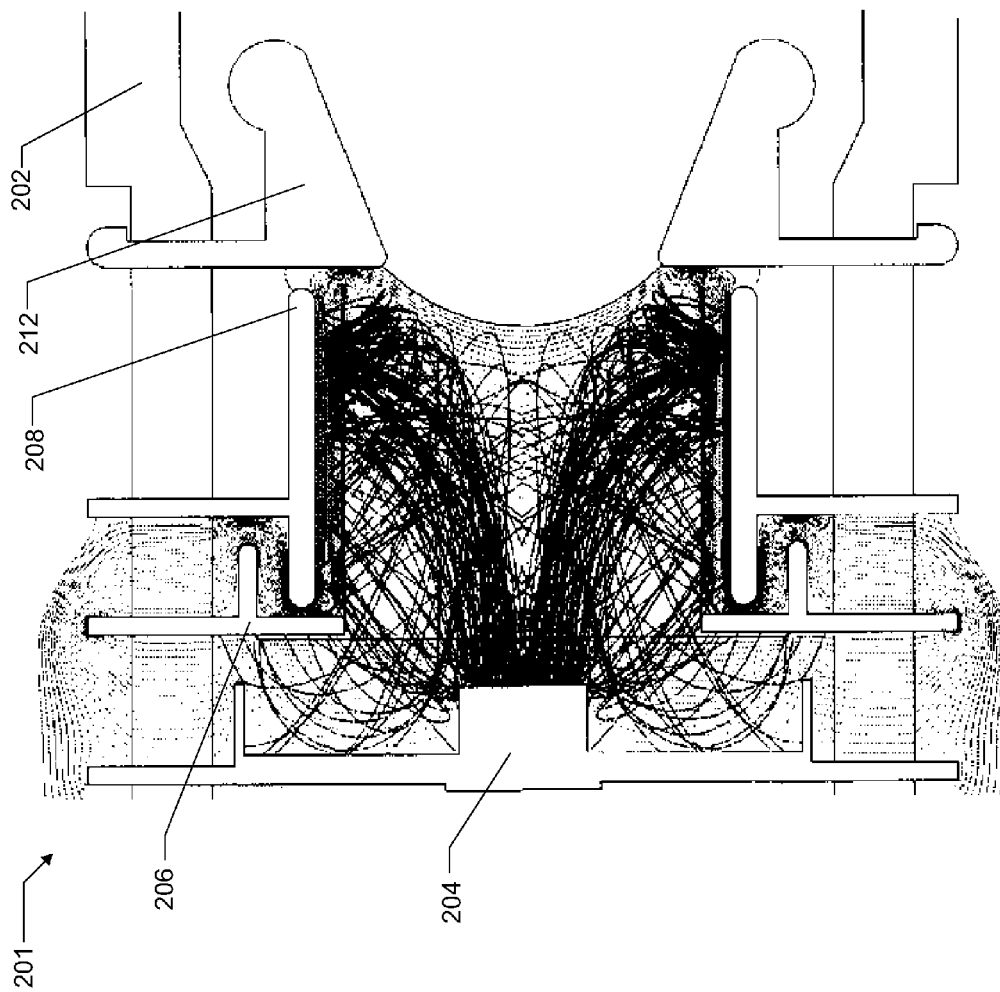
FIG. 2 is a schematic cutaway view of the ion source of FIG. 1 showing electron paths when in a first mode of operation.
Figure 3:
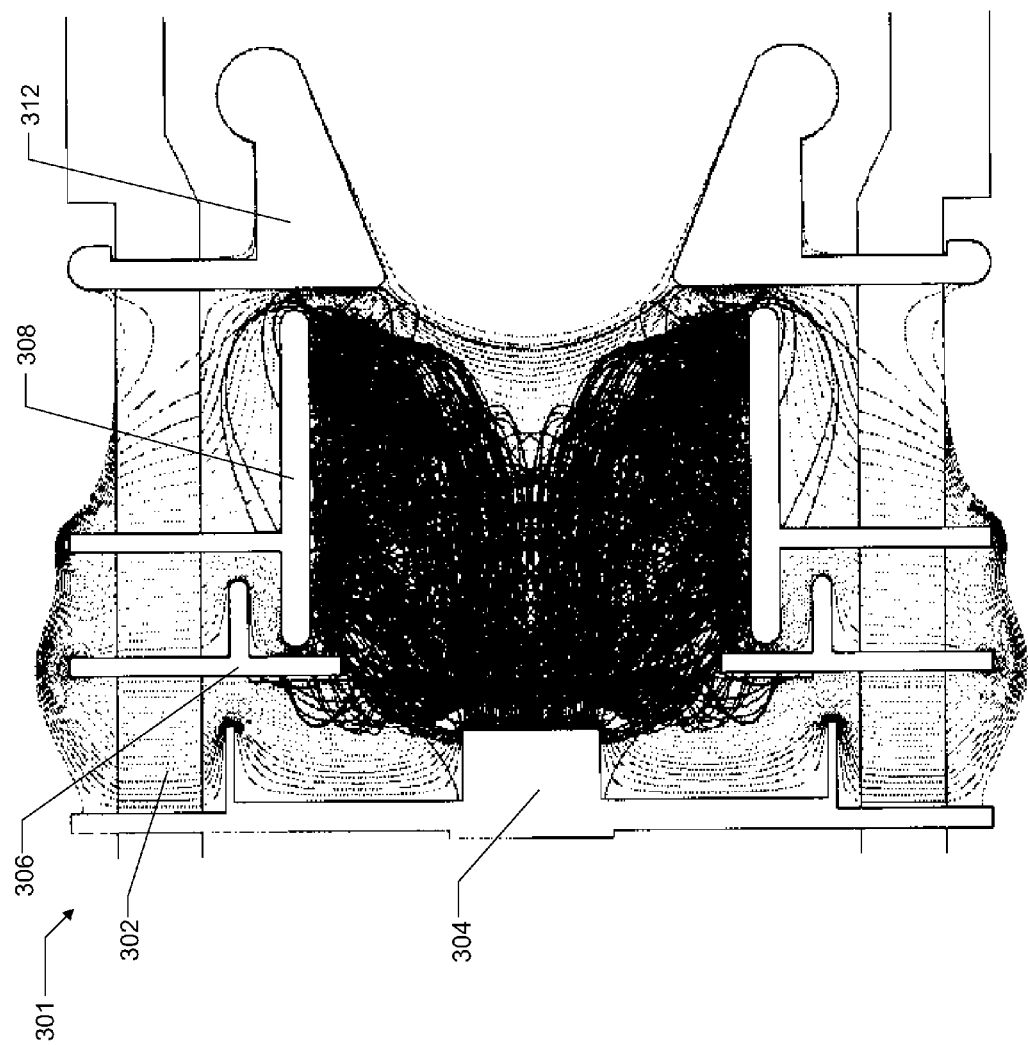
FIG. 3 is a schematic cutaway view of the ion source of FIG. 2 showing electron paths when in a second mode of operation.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. In FIGS. 1-3 elements separated by century are similar, although it should be understood that this does not apply to FIG. 4.

Referring initially to FIG. 1, a radiation generator 100 including an ion source 101 according to the present disclosure is now described. The radiation generator 100 includes a housing (not shown) having an interior surface, with an insulator 102 on the interior surface. The housing may be a vacuum tube, for example, and may be at a ground potential. The insulator 102 may be a high voltage insulator constructed from ceramic material, such as Al2O3. An ionizable gas is contained within the housing, such as deuterium or tritium, at a pressure of 2 mTorr to 20 mTorr for example.

The ion source 101 is included within the housing. The ion source 101 shown and described herein is of the ohmically heated variety, but it should be understood that other ion sources 101, such as those based on a penning trap or using a field emitter array cathode, may also be used. The ion source 101 includes a cathode 104, a cathode grid 106 downstream of the cathode, and a reflector electrode 108 downstream of the cathode grid 106. The reflector electrode 108 is positioned generally perpendicularly to the cathode grid 106, although it should be understood that in some applications the reflector electrode may be at other angles with respect to the cathode grid. A reflector grid 110 is positioned radially inward of, and parallel to, the reflector electrode 108, although it should likewise be understood that the reflector grid need not be parallel to the reflector electrode. An extractor electrode 112 is downstream of the reflector electrode 108, and an optional dome screen 114 extends across an opening defined in the extractor electrode 114. The extractor electrode 112, the cathode grid 106, and the reflector grid 110 define an ionization region 116 therebetween.

A first mode of operation that uses electrostatic confinement to increase the path length traveled by electrons in the ionization region 116, and thus increases the number of ions produced, is now described. During operation in this first mode, the cathode 104 emits electrons, for example via thermionic emission, although it should be understood that other types of cathodes may be used. The cathode 104 and the cathode grid 106 have a first voltage difference such that a resultant electric field in the ion source 101 accelerates the electrons through the cathode grid and into the ionization region 116 on a trajectory toward the extractor electrode 112. This first voltage difference may have an absolute value of between 100 V and 250 V, for example with the cathode 104 being at ground and the cathode grid 106 being at +200 V.

The reflector grid 110 and the extractor electrode 112 have a second voltage difference less than the first voltage difference such that the electric field slows the electrons as they near the extractor electrode and repels the electrons on a trajectory away from the extractor electrode and toward the reflector electrode 108. The second voltage difference may have an absolute value of between 90 V and 240 V, for example, with the reflector grid 110 being at +200 V and the extractor electrode 112 being at +12 V. Although in this example the reflector grid 110 and the cathode grid 106 are at a same voltage, in some applications, they may be at different voltages, as will be appreciated by those of skill in the art.

When the electrons are emitted by the cathode 104, they have a high energy, for example 200 eV. This can be too much energy for optimal ionization. As the electrons approach the extractor electrode 112, however, they are slowed and thus lose energy. At some point in their trajectory toward the extractor electrode 112, the electrons therefore are at an optimal ionization energy (a hydrogen ionizing energy), for example 100 eV, and some of the electrons may interact with the ionizable gas molecules to create ions.

As explained, by biasing the reflector grid 110 and extractor electrode 112 as described above, the electrons are repelled on a trajectory away from the extractor electrode and toward the reflector electrode 108. The reflector electrode 108 has a negative potential, for example between −5 V and −100 V, such that the electric field repels electron that pass through the reflector grid 110 away from the reflector electrode and back into the ionization region 116. It should be noted that the voltage on the reflector grid 110 shields the ionization region 110 from the effect of the negative potential on the reflector electrode 108.

The statistical likelihood of an individual electron passing close enough to an ionizable gas molecule to react therewith is low, however. Consequently, the ratio of electrons emitted to ions created is quite low. The present disclosure increases the path length traveled by the electrons by repelling the electrons away from the extractor electrode 212 and toward the reflector cylinder 208, and then repelling the electrons away from the reflector cylinder and back into the ionization area. These electrons paths are shown in FIG. 2. By increasing the path that the electrons travel, the likelihood of a given electron interacting with an ionizable gas molecule increases, and thus, the ionization ratio is increased, for example, by up to, or in some cases beyond, a factor of two.

Referring back to FIG. 1, a second mode of operation of the ion source 101 where the ionization rate is increased through the generation of additional electrons is now described. During operation, as in the first mode of operation, the cathode 104 generates electrons, referred to as primary electrons in this mode for reasons that will be explained below, and the cathode grid 106 have a first voltage difference such that a resultant electric field in the ion source accelerates the primary electrons through the cathode grid and into the ionization region on a trajectory toward the extractor electrode. This electron generation and acceleration is the same as in the first mode of operation as described above, and therefore needs no further discussion.

Also as in the first mode of operation, the reflector grid 110 and the extractor electrode 112 have a second voltage difference less than the first voltage difference such that the electric field slows the primary electrons as they near the extractor electrode and repels the primary electrons on a trajectory away from the extractor electrode and toward the reflector electrode 108. This slowing and repelling of the electrons is likewise the same as in the first most of operation as described above, and also needs no further discussion.

Differently in this second mode of operation, the cathode 104 and reflector electrode 108 have a third voltage difference less than the first voltage difference such that some of the primary electrons traveling back due to being repelled by the extractor electrode 112 are attracted to and strike the reflector electrode. The third voltage difference may have an absolute value of 100 V, for example, with the cathode 104 being at ground, and the reflector electrode 108 being at +100 V.

When these primary electrons strike the reflector electrode 108, secondary electrons having an electron energy less than the primary electrons are created. While numerous materials may create secondary electrons when struck by primary electrons, certain materials are particularly advantageous. For example, the reflector electrode 108 may be constructed from a material having a sufficient secondary emission coefficient, for example oxidized BeCu or BeNi, wherein the oxidation layer is thin such that the reflector electrode is conductive enough to provide milliamperes of secondary emission current. Such a material may have a secondary emission coefficient ranging from 2 to 5, with an oxidation layer having a thickness ranging from 25 to 100 angstrom. The reflector electrode 108 may produce a secondary emission current of 2 to 5 times the current striking the reflector electrode, for example 40 to 100 mA.

It should also be noted that there is a fourth voltage difference between the reflector electrode 108 and reflector grid 110, for example having an absolute value of 100 V, with the reflector electrode at +100 V and the reflector grid at +200 V. This affects the energy at which the primary electrons impact the reflector electrode, helping to set it so as to increase the secondary electron yield. In addition, this positive potential between the reflector grid 110 and the reflector electrode 108 causes the resultant electric field to attract the primary and secondary electrons away from the reflector electrode and back into the ionization region. The electron paths for this mode of operation can be seen in FIG. 3. Operation according to this mode increases the number of electrons in the ionization region 116 by a factor of up to 5.

The secondary electrons are created at a lower electron energy than the primary electrons, for example at 100 eV as opposed to 200 eV. This lower energy of the secondary electrons is more suited for ionizing hydrogen isotopes than the higher energy of the primary electrons. At least some of the primary or secondary electrons, when in the ionization region, interact with the ionizable gas to create ions. It should be noted that the primary electrons may interact with the ionizable gas to create ions as they approach the extractor electrode 112, or as they are reflected back toward the reflector electrode 108. The secondary electrons may interact with the ionizable gas to create ions as they pass through the reflector grid 110 and into the ionization region 116. By increasing the number of electrons in the ionization region 116, the likelihood of a given electron interacting with an ionizable gas molecule increases, and thus, the ionization ratio is increased, for example by a factor of 2 to 5.

The voltage between the dome screen 114 and reflector grid 110 serves to focus the ions created into a cohesive beam for extraction through the extractor electrode 112, and defines the energy the ions reach as they approach the extractor electrode. Once ions are generated by either mode of operation, they are extracted through the extractor electrode 112. A suppressor electrode 120 is downstream of the extractor electrode 112. There is a voltage difference between the extractor electrode 112 and the suppressor electrode 120 such that the electric field in the radiation generator 100 accelerates the ions generated in the ion source 101 downstream toward a target 122. When the ions strike the target 122, neutrons may be generated.

Figure 4:
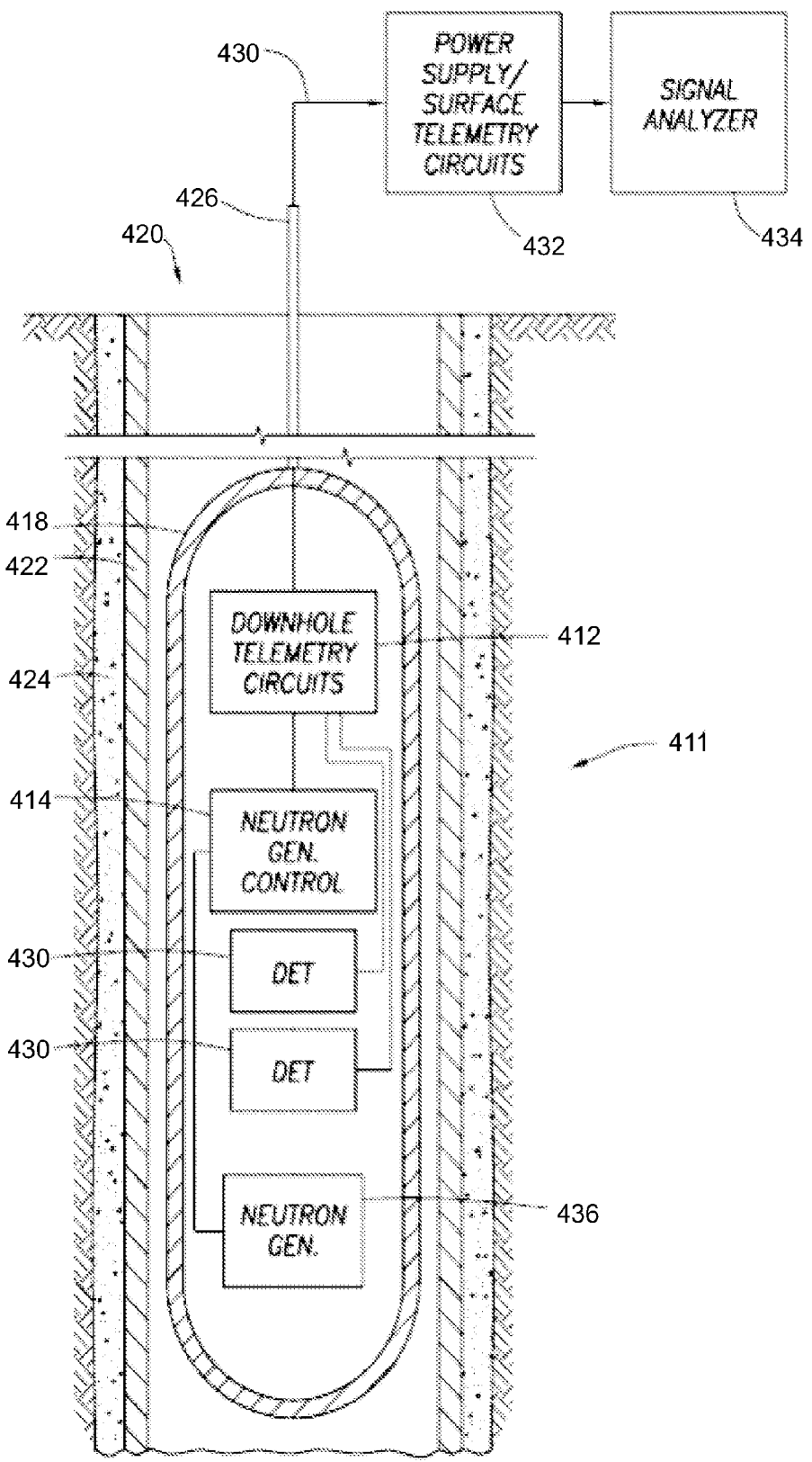
FIG. 4 is a schematic block diagram of a well logging instrument in which the radiation generator of FIG. 1 may be used.

Turning now to FIG. 4, an example embodiment of a well logging instrument 411 is now described. A pair of radiation detectors 430 are positioned within a sonde housing 418 along with a radiation generator 436 (e.g., as described above) and associated high voltage electrical components (e.g., power supply). The radiation generator 436 employs an ion source in accordance with the present invention and as described above. Supporting control circuitry 414 for the radiation generator 436 (e.g., low voltage control components) and other components, such as downhole telemetry circuitry 412, may also be carried in the sonde housing 418.

The sonde housing 418 is to be moved through a borehole 420. In the illustrated example, the borehole 420 is lined with a steel casing 422 and a surrounding cement annulus 424, although the sonde housing 418 and radiation generator 436 may be used with other borehole configurations (e.g., open holes). By way of example, the sonde housing 418 may be suspended in the borehole 420 by a cable 426, although a coiled tubing, etc., may also be used. Furthermore, other modes of conveyance of the sonde housing 418 within the borehole 420 may be used, such as wireline, slickline, Tough Logging Conditions (TLC) systems, and logging while drilling (LWD), for example. The sonde housing 418 may also be deployed for extended or permanent monitoring in some applications.

A multi-conductor power supply cable 430 may be carried by the cable 426 to provide electrical power from the surface (from power supply circuitry 432) downhole to the sonde housing 418 and the electrical components therein (i.e., the downhole telemetry circuitry 412, low-voltage radiation generator support circuitry 414, and one or more of the above-described radiation detectors 430). However, in other configurations power may be supplied by batteries and/or a downhole power generator, for example.

The radiation generator 436 is operated to emit neutrons to irradiate the geological formation adjacent the sonde housing 418. Gamma-rays that return from the formation are detected by the radiation detectors 430. The outputs of the radiation detectors 430 are communicated to the surface via the downhole telemetry circuitry 412 and the surface telemetry circuitry 432 and may be analyzed by a signal analyzer 434 to obtain information regarding the geological formation. By way of example, the signal analyzer 434 may be implemented by a computer system executing signal analysis software for obtaining information regarding the formation. More particularly, oil, gas, water and other elements of the geological formation have distinctive radiation signatures that permit identification of these elements. Signal analysis can also be carried out downhole within the sonde housing 418 in some embodiments.

While the disclosure has been described with respect to a limited number of embodiments, those skilled in the art, having benefit of this disclosure, will appreciate that other embodiments can be envisioned that do not depart from the scope of the disclosure as disclosed herein. Accordingly, the scope of the disclosure shall be limited only by the attached claims.

The invention claimed is:

1. An ion source for use in a radiation generator comprising:
   a cathode to emit primary electrons;
   a cathode grid downstream of the cathode;
   a reflector electrode downstream of the cathode grid;
   a reflector grid radially inward of the reflector electrode; and
   an extractor electrode downstream of the reflector electrode, the extractor electrode and cathode grid defining an ionization region therebetween;
   the cathode and the cathode grid having a first voltage difference such that a resultant electric field in the ion source accelerates the primary electrons through the cathode grid and into the ionization region on a trajectory toward the extractor electrode;
   the reflector grid and the extractor electrode having a second voltage difference less than the first voltage difference such that the electric field slows the primary electrons as they near the extractor electrode and repels the primary electrons on a trajectory away from the extractor electrode and toward the reflector electrode;
   the cathode and reflector electrode having a third voltage difference less than the first voltage difference such that some of the primary electrons are attracted to and strike the reflector electrode, creating secondary electrons having an electron energy less than the primary electrons;
   the reflector grid having a positive potential with respect to the reflector electrode such that the electric field attracts the primary and secondary electrons away from the reflector electrode and into the ionization region;
   at least some of the primary or secondary electrons, when in the ionization region, interacting with an ionizable gas to create ions.

2. The ion source of claim 1, wherein the reflector electrode is positioned generally perpendicularly to cathode grid.

3. The ion source of claim 1, wherein the cathode grid and the reflector grid are at a same potential.

4. The ion source of claim 1, wherein the cathode grid and the reflector grid are not at a same potential.

5. The ion source of claim 1, wherein the first voltage difference is between 100 V and 250 V.

6. The ion source of claim 1, wherein the first voltage difference results in an electron energy sufficient to ionize at least one of hydrogen gas, deuterium gas, and tritium gas.

7. The ion source of claim 1, wherein the reflector electrode comprises beryllium copper or beryllium nickel.

8. The ion source of claim 1, wherein the extractor electrode has an opening defined therein; and further comprising a dome screen coupled to the extractor electrode and covering the opening.

9. A well logging instrument comprising:
   a sonde housing;
   a radiation generator carried by the sonde housing and comprising
      an ion source comprising
         a cathode to emit primary electrons,
         a cathode grid downstream of the cathode,
         a reflector electrode downstream of the cathode grid,
         a reflector grid radially inward of the reflector electrode, and
         an extractor electrode downstream of the reflector electrode, the extractor electrode and cathode grid defining an ionization region therebetween,
         the cathode and the cathode grid having a first voltage difference such that a resultant electric field in the ion source accelerates the primary electrons through the cathode grid and into the ionization region on a trajectory toward the extractor electrode,
         the reflector grid and the extractor electrode having a second voltage difference less than the first voltage difference such that the electric field slows the primary electrons as they near the extractor electrode and repels the primary electrons on a trajectory away from the extractor electrode and toward the reflector electrode,
         the cathode and reflector electrode having a third voltage difference less than the first voltage difference such that some of the primary electrons are attracted to and strike the reflector electrode, creating secondary electrons having an electron energy less than the primary electrons,
         the reflector grid having a positive potential with respect to the reflector electrode such that the electric field attracts the primary and secondary electrons away from the reflector electrode and into the ionization region,
         at least some of the primary or secondary electrons, when in the ionization region, interacting with an ionizable gas to create ions;
      a suppressor electrode downstream of the ion source; and
      a target downstream of the suppressor electrode;
      the extractor electrode and the suppressor electrode having a voltage difference such that a resultant electric field in the radiation generator accelerates the ions generated by the ion source toward the target.

10. The well logging instrument of claim 9, wherein the reflector electrode is positioned generally perpendicularly to cathode grid.

11. The well logging instrument of claim 9, wherein the cathode grid and the reflector grid are at a same potential.

12. The well logging instrument of claim 9, wherein the cathode grid and the reflector grid are not at a same potential.

13. The well logging instrument of claim 9, wherein the first voltage difference is between 100 V and 250 V.

14. The well logging instrument of claim 9, wherein the first voltage difference results in an electron energy sufficient to ionize at least one of hydrogen gas, deuterium gas, and tritium gas.

15. The well logging instrument of claim 9, wherein the reflector electrode comprises beryllium copper or beryllium nickel.

16. A method of operating an ion source in a radiation generator comprising:
   emitting primary electrons from a cathode;
   generating a first voltage difference between the cathode and a cathode grid positioned downstream of the cathode grid such that a resultant electric field in the ion source accelerates the primary electrons through the cathode grid and into an ionization region on a trajectory toward an extractor electrode;

generating a second voltage difference less than the first voltage difference between a reflector grid downstream of the cathode grid and the extractor electrode such that the electric field slows the primary electrons as they near the extractor electrode and repels the primary electrons on a trajectory away from the extractor electrode and toward a reflector electrode radially outward of the reflector grid;

generating a third voltage difference less than the first voltage difference between the cathode and the reflector electrode such that some of the primary electrons are attracted to and strike the reflector electrode, creating secondary electrons having an electron energy less than the primary electrons;

generating a positive potential at the reflector grid with respect to the reflector electrode such that the electric field attracts the primary and secondary electrons away from the reflector electrode and into the ionization region; and generating ions via interactions between at least some of the primary or secondary electrons, when in the ionization region, and an ionizable gas.

17. The method of claim 16, wherein the reflector electrode is positioned generally perpendicularly to cathode grid.

18. The method of claim 16, wherein the cathode grid and the reflector grid are at a same potential.

19. The method of claim 16, wherein the cathode grid and the reflector grid are not at a same potential.

20. The method of claim 16, wherein the first voltage difference results in an electron energy sufficient to ionize at least one of hydrogen gas, deuterium gas, and tritium gas.

* * * * *